United States Patent [19]

van Seeters

[11] Patent Number: 5,283,528

[45] Date of Patent: Feb. 1, 1994

[54] CIRCUIT ARRANGEMENT FOR MEASURING THE RATIO OF THE CAPACITANCE VALUES OF TWO CAPACITORS

[75] Inventor: Josephus M. van Seeters, Berneck, Switzerland

[73] Assignee: Leica Heerbrugg AG, Heerbrugg, Fed. Rep. of Germany

[21] Appl. No.: 845,938

[22] Filed: Mar. 6, 1992

[30] Foreign Application Priority Data

Mar. 8, 1991 [DE] Fed. Rep. of Germany ....... 4107366

[51] Int. Cl.$^5$ ..................... G01R 11/52; G01R 27/26
[52] U.S. Cl. ................................................. 324/679
[58] Field of Search ................... 324/679, 678; 73/218

[56] References Cited

U.S. PATENT DOCUMENTS

| | | | |
|---|---|---|---|
| 4,386,312 | 5/1983 | Briefer | 324/679 |
| 4,458,196 | 7/1984 | Goyal et al. | 324/57 |
| 4,605,985 | 8/1986 | Watson | 361/283 |
| 4,794,320 | 12/1988 | Chang | 324/60 |
| 4,797,603 | 1/1989 | Choisnet | 324/60 |
| 4,820,973 | 4/1989 | Alvarez | 324/61 |
| 5,092,171 | 3/1992 | Wallrafen | 73/304 |

FOREIGN PATENT DOCUMENTS

| | | |
|---|---|---|
| 0178768 | 4/1986 | European Pat. Off. . |
| 0303442 | 2/1989 | European Pat. Off. . |
| 0318596 | 6/1989 | European Pat. Off. . |
| 0402522 | 11/1989 | European Pat. Off. . |
| 0438103A2 | 7/1991 | European Pat. Off. . |
| 2523446 | 9/1976 | Fed. Rep. of Germany . |
| 3623136 | 1/1987 | Fed. Rep. of Germany . |
| 2177806A | 1/1987 | United Kingdom . |

Primary Examiner—Walter E. Snow
Attorney, Agent, or Firm—Foley & Lardner

[57] ABSTRACT

An apparatus and method for measuring the ratio of the capacitance values $C_1$, $C_2$ of two capacitors having very small capacitances, where the capacitors to be compared are interconnected by means of one of their one electrodes. A signal voltage $U_i(t)$ which can be differentiated, can be reproduced over at least two signal periods and has defined slopes is applied to the interconnected electrodes of the capacitors. The two other electrodes of the capacitors are each connected to current amplifiers (3,4). The amplified output signals $U_1(t)$, $U_2(t)$ of the two capacitors are supplied to an A/D convertor and during a first signal period, two digital amplitude values $Us_1$, $Us_2$ of the output signals of the one capacitor at an interval of half a signal period (T/2) are determined and, subsequently thereto and likewise at an interval of half a signal period, during the second signal period, two digital amplitude values $Us_3$, $Us_4$ of the output signals of the other capacitor are determined. These values are utilized to determine and output the capacitance ratio in accordance with $$\frac{C_1}{C_2} = \frac{(U_{s1} - U_{s2})}{(U_{s3} - U_{s4})}.$$

The circuit arrangement can advantageously be used in an apparatus for inclination and/or acceleration measurements, whose sensor comprises two fixed electrode plates (10, 11) and a capacitor plate (15) arranged in a moving manner between them.

11 Claims, 1 Drawing Sheet

CIRCUIT ARRANGEMENT FOR MEASURING THE RATIO OF THE CAPACITANCE VALUES OF TWO CAPACITORS

BACKGROUND OF THE INVENTION

1. Field of the Invention

The invention relates to an apparatus and method for measuring the ratio of the capacitance values of two capacitors having very small capacitances which have very small differences between them and are interconnected by means of one of their electrodes. Capacitances in the picofarad range and capacitance differences down to the femtofarad range are intended to be regarded as small.

2. Description of the Related Art

A circuit arrangement for measuring the quotient of the capacitance values of two capacitors which are to be compared with one another and are interconnected at one electrode is disclosed in DE 36 23 136 C2. The capacitors are interconnected on the signal output side. A DC signal is supplied via a switch to the free electrode of the one capacitor and is supplied via an operational amplifier and a further switch to the free electrode of the other capacitor. The two switches are connected in antiphase. Additionally connected in series with the operational amplifier is a further switch which opens delayed in time with respect to the other switches. During the time when this switch is open, currents flow from the two capacitors through the switch upstream of the operational amplifier. The mean current during this time is equal to zero. From this it results that the ratio of the input voltages of the capacitors is proportional to their capacitances.

Because of the use of the multiplicity of switches, the known method is problematic particularly for the measurement of very small capacitances. The control signals of the switches lead to small currents which are in the same order of magnitude as the currents flowing through the capacitances, and they are temperature-dependent. A disadvantage is also seen in that the assumption concerning the mean current is based on a time measurement.

The above-mentioned document discloses having pure voltage measurement at the output of the operational amplifier. The two capacitors are connected into the measurement circuit alternately. The frequency of the signal voltage can be selected to be up to the order of magnitude of 300 kHz and is limited by the response time of the analog switches. With a knowledge of the capacitance of one of the capacitors as a reference value, and measurement of the signal output values at the operational amplifier, it is intended to be possible to determine the other capacitance or its change in a sensitive manner. No statements are published on the lower limits of the measurable capacitances.

The measurement of capacitances in the picofarad range is necessary, for example for the characterization of integrated circuits using MOS or MIS technology. In this case, the capacitance must also be measured over a wide frequency range from a few Hertz to a few Megahertz. A suitable circuit arrangement is specified in EP 0,318,596 A1.

The equivalent circuit of an integrated circuit is a parallel circuit consisting of a capacitance and a resistance whose magnitude is not negligible. A DC voltage of variable amplitude and a superimposed AC voltage of variable frequency are applied to the component to measure the impedance. The AC voltage signal is preferably a triangular-wave signal. The output signal is converted into an AC signal via an operational amplifier with feedback. The top gradient and the amplitude of this AC signal are determined at a defined measurement time. The magnitude of the capacitance is then derived from the amplitude and that of the parallel resistance is derived from the top gradient. For absolute measurements, a known circuit can alternatively be inserted into the measurement arrangement as a reference.

It is not possible to measure the ratio of the capacitances of two unknown capacitors directly using this circuit.

The measurement principle of a number of sensors for inclination and/or acceleration indication is based on determining small capacitance changes in capacitor systems having very small capacitances. Such a sensor and a suitable evaluation circuit are described in DE-PS 2,523,446. The sensor comprises two electrode plates which are opposite one another at a fixed spacing between which a capacitor plate is located, suspended in a sprung manner.

The two electrode plates are connected to a generator for generating an AC voltage such that there are voltages of equal amplitude and frequency, but phase-shifted with respect to one another through 180°, on the electrode plates. The voltages acting on the capacitor plate thus counteract one another when the capacitor plate is located precisely between the electrode plates. If the capacitor plate deviates under the influence of gravity or inertia forces from its null position, an AC voltage is produced by the change in the capacitances between the electrode plates and the capacitor plate.

The capacitor plate is electrically connected to a measurement transducer in which this AC voltage is converted into a measurement signal for indicating the angle change in the position of the sensor. However, the AC voltage can also be supplied to a regulator which generates therefrom a regulated DC voltage signal which is superimposed on the AC voltage applied to the electrode plates. The regulator is configured such that the capacitor plate is held in its null position against the force acting on it. The angle change of the capacitor plate which is proportional to the inclination and/or acceleration can then likewise be determined from the DC voltage regulation signals.

The capacitance changes to be detected in the sensor are very small so that parasitic capacitances and leakage resistances of the connecting wires and other components of the printed-circuit board used for constructing the circuit have a critical effect on the accuracy and sensitivity. Regulation at the null position is very complex. Since the DC voltage used for returning the capacitor plate must be relatively high, there are additional insulation problems and particular requirements for the mechanical design of the sensor.

SUMMARY OF THE INVENTION

Therefore it is an object of the invention to provide a circuit arrangement and a method by means of which the ratio of the values of two capacitances can be determined by direct comparison, the determination being insensitive to the construction of the circuit, and in which high accuracy can be achieved even over only a few measurement cycles and which operates linearly over a large measurement range. The circuit arrangement is intended to be capable of implementation at a favorable price using commercially available electronic components.

An apparatus and method is provided for measuring the ratio of two capacitance values $C_1$ and $C_2$, of two capacitors having very small capacitances, the capacitors to be compared having one of their electrodes interconnected. A signal voltage $U_i(t)$, which can be differentiated and has defined slopes, over at least two signal periods is supplied to the interconnected electrodes of the capacitors, the two capacitors being arranged in parallel paths with respect to the signal voltage. Current amplifiers are connected to the two electrodes of the capacitors not connected to each other, the current amplifiers producing amplified output signals $U_1(t)$, $U_2(t)$. An A/D convertor means receives the amplified output signals $U_1(t)$ $U_2(t)$ of the two capacitors, and determines during a first signal period, two digital amplitude values $U_{s1}$, $U_{s2}$ of the output signals of one capacitor at an interval of half a signal period (T/2) and, subsequently thereto and likewise at an interval of half a signal period, determines during the second signal period, two digital amplitude values $U_{s3}$, $U_{s4}$ of the output signals of the other capacitor. The capacitance ratio is determined in accordance with $$\frac{C_1}{C_2} = \frac{(U_{s1} - U_{s2})}{(U_{s3} - U_{s4})}.$$

In another embodiment of the invention two A/D convertor means, are connected respectively to the amplified output signals $U_1(t)$, $U_2(t)$ of the two capacitors, for determining, parallel in time, two digital amplitude values $U_{s1}$, $U_{s2}$ of the output signals of one capacitor and two digital amplitude values $U_{s3}$, $U_{s4}$ of the output signals of the other capacitor at an interval of half a signal period (T/2) respectively. The determining means determines and outputs the capacitance ratio in accordance with, $$\frac{C_1}{C_2} = \frac{(U_{s1} - U_{s2})}{(U_{s3} - U_{s4})}.$$

Also provided is a method for measuring the quotient of two capacitance values $C_1$ and $C_2$, of two capacitors having very small capacitances, the capacitors to be compared being interconnected by means of one of their electrodes, comprising the steps of:

arranging the interconnected electrodes of two capacitors such that the two capacitors are arranged in parallel paths with respect to a signal voltage $U_i(t)$;

producing the signal voltage $U_i(t)$ over at least two signal periods, which can be differentiated, and has defined slopes;

applying the signal voltage to interconnected electrodes of the capacitors;

amplifying in current amplifiers output signals from the two electrodes of the capacitors which are not connected to each other;

converting the amplified output signals $U_1(t)$, $U_2(t)$ of the two capacitors to digital amplitude values in an A/D convertor means;

determining, during a first signal period, two digital amplitude values $U_{s1}$, $U_{s2}$ of the output signals of one capacitor at an interval of half a signal period (T/2) and, subsequently thereto and likewise at an interval of half a signal period, determining, during the second signal period, two digital amplitude values $U_{s3}$, $U_{s4}$ of the output signals of the other capacitor; and determining and outputting the capacitance ratio in accordance with $$\frac{C_1}{C_2} = \frac{(U_{s1} - U_{s2})}{(U_{s3} - U_{s4})}.$$

The circuit arrangement can advantageously be used in an apparatus for inclination and/or acceleration measurements, whose sensor comprises two fixed electrode plates (10, 11) and a capacitor plate (15) arranged in a moving manner between them.

The circuit arrangement according to the invention and its application in an inclination and/or acceleration sensor are shown schematically in the drawing and are explained in more detail using the exemplary embodiments shown. Other objects and advantages of this invention will become apparent from the following description and accompanying drawings.

DETAILED DESCRIPTION OF THE PREFERRED EMBODIMENTS

Figure 1:
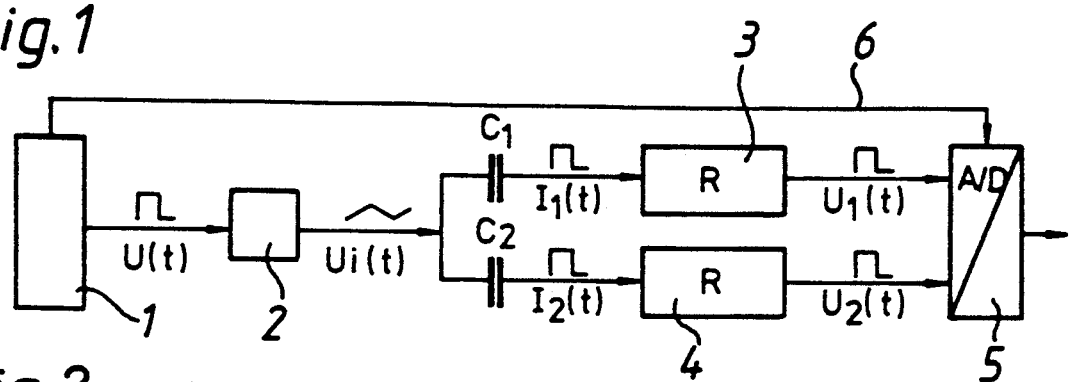
FIG. 1 shows a schematic circuit arrangement for one embodiment of the present invention.

In FIG. 1, a square-wave generator 1 generates square-wave voltage pulses of period length T. The square-wave pulses must be reproducible over at least two successive signal periods, that is to say the signal amplitudes and the duration of the mutually corresponding half periods must be identical. In this case, it is not absolutely essential for the duration of the half periods to be precisely T/2. This will be discussed further below.

The square-wave pulse train is converted in an integrator 2 into a triangular-wave pulse train $U_1(t)$ having a peak-to-peak value $U_{ss}$. Both the generation of square-wave signals and the conversion into triangular-wave signals can be implemented particularly simply and economically using standard electronic components. The triangular-wave signal has well-defined slopes which can be differentiated very well, if necessary, the differentiated signal being a square-wave whose signal amplitude depends entirely on the slope gradient of the triangular-wave signal.

The invention makes use of this fact which is known per se, since the capacitances which are to be compared with one another represent a pure differentiating element for an applied voltage (Ui) in accordance with the relationship $$I = C \cdot \frac{dUi}{dt}.$$

The capacitances $C_1$ and $C_2$ which are to be compared with one another are interconnected by means of their one electrode and the triangular-wave voltage signal is supplied thereto. At the output of the two capacitors there arises then in each case a square-wave current pulse $I_1(t)$ $I_2(t)$ which is converted in downstream current amplifiers (3,4) into an amplified square-wave voltage pulse $U_1(t)$, $U_2(t)$. Since these voltage pulses are used directly for determining the measured value, the transmission behavior of the two current amplifiers should be identical, within a specific tolerance. If that is not the case, the different gain factor must be taken into account subsequently.

A transimpedance amplifier is preferably selected as the current amplifier, whose current gain is determined entirely by the magnitude of its feedback resistor R. Such transimpedance amplifiers can easily be designed for a specified synchronism, the absolute magnitude of the gain factor being ignored when comparing the signals $U_1(t)$ and $U_2(t)$.

The signals $U_1(t)$ and $U_2(t)$ are initially converted from analog to digital form in a downstream functional block 5. The microprocessor in this block fixes in each case the two digital amplitude values from each pulse sequence $U_1(t)$ and $U_2(t)$ starting from a defined first time point and then at an interval of half a signal period length T/2 for further computer processing in the microprocessor in the functional block 5. The microprocessor receives a clock signal via the line 6 in order to synchronize the square-wave signal generated by the square-wave generator 1 to the signal train processed in the microprocessor of the functional block 5. The square-wave generator 1, the integrator 2 and the functional block 5 can, of course, also be designed as an integrated circuit. It is also possible to obtain in each case the two digital amplitude values parallel in time, if separate A/D convertors with identical characteristics are provided for each measurement path. The signal voltage $U_i(t)$ then needs to have the defined characteristic only over one signal period. However, because of the second A/D convertor, which has to be searched for in a qualified manner, the circuit becomes somewhat more expensive.

Figure 2:
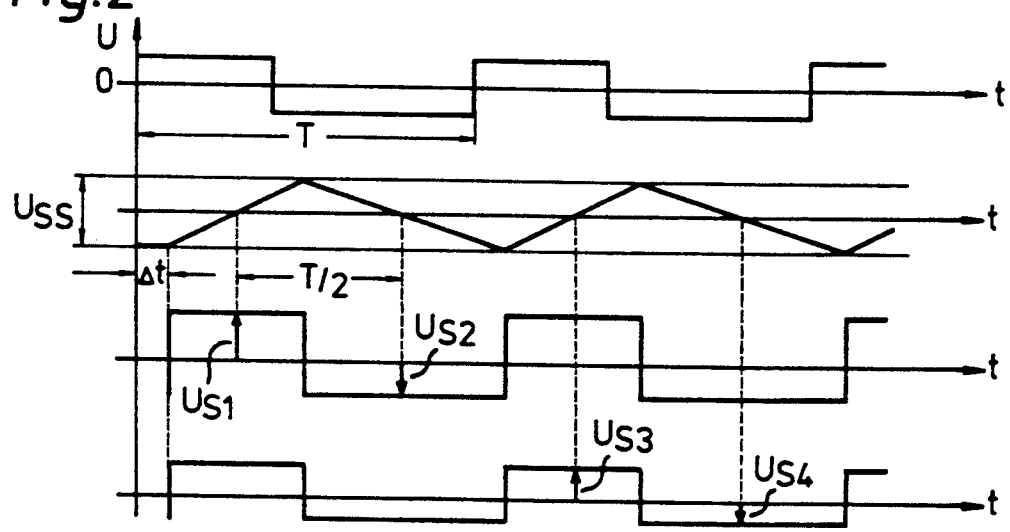
FIG. 2 shows a signal pulse diagram explaining the functioning and operation of the present invention.

It is intended to explain the formation and sampling of the signal trains using the signal pulse diagram in FIG. 2.

The first line of the diagram shows the response of the voltage pulses U(t) generated by the square-wave generator 1. The period length is intended to be T. Two successive pulses are shown which have a corresponding amplitude and time response. Using signal generators which can now be obtained as standard production items, finely accurate symmetrical pulse trains can normally be generated. However, in the exemplary embodiment it is intended to start from the more general case where the two period sections of the square-wave pulse are of different length, in order to show that the circuit arrangement according to the invention is independent of these signal generation tolerances.

The second line of the diagram shows the response of the triangular-wave signal $U_i(t)$ at the output of the integrator 2. Because of the propagation time delay in the integrator 2, this pulse train starts displaced by $\Delta t$ with respect to the square-wave signal at the input of the integrator 2. Once again, the period length is T. Because of the shorter first half period of the square-wave signal, the rising edge of the triangular-wave signal is steeper than the falling edge.

The third line of the diagram shows the signal response after differentiation of the capacitance $C_1$ ($I_1(t)$ and $I_2(t)$) and the gain in the current amplifier 3 ($U_1(t)$ and $U_2(t)$). The signal amplitude of the first half period of the signal is greater than the signal amplitude of the second half period in accordance with the steeper rising edge of the triangular-wave signal. Amplitude determination takes place in the first half period as the rising edge of the triangular-wave signal passes through zero. With respect to the start pulse in line 1, this occurs after time $\Delta t + T/4$ in the case of a completely symmetrical square-wave signal. In the case shown, the first sampling time occurs slightly earlier. However, the next sampling time then follows at an interval T/2.

The signal response in the fourth line of the diagram corresponds to that shown in the third line but after differentiation on the capacitance $C_2$ and amplification in the current amplifier 4. Subject to the precondition that $C_1 \neq C_2$, a deviating signal amplitude is produced. The sampling of the signal amplitudes takes place connected in time to that preceding, once again at an interval T/2. The amplitude values $U_{s1}$, $U_{s2}$, $U_{s3}$, $U_{s4}$ are available thereafter as measured values.

The linking of these measured values to an output value of the microprocessor in the functional block 5, which corresponds to the ratio of the capacitance values $C_1$ and $C_2$ to one another, takes place on the basis of the following reasoning. As is known, $$U_s = R \cdot C \cdot \frac{dU_i}{dt}.$$

From this it follows that:

$$U_{s1} = R \cdot C_1 \cdot \frac{U_{ss}}{T/2}$$

$$U_{s2} = R \cdot C_1 \cdot \frac{(-U_{ss})}{T/2}$$

$$U_{s3} = R \cdot C_2 \cdot \frac{U_{ss}}{T/2}$$

$$U_{s4} = R \cdot C_2 \cdot \frac{(-U_{ss})}{T/2}$$

Substitution results in:

$$\frac{(U_{s1} - U_{s2})}{(U_{s3} - U_{s4})} = \frac{C_1}{C_2}$$

The circuit arrangement thus directly enables the determination of the ratio of the capacitance values, none of the constant parameters of the components nor the measurement signal pulses, appearing in the measurements because of the symmetrical construction of the circuit arrangement.

Figure 3:
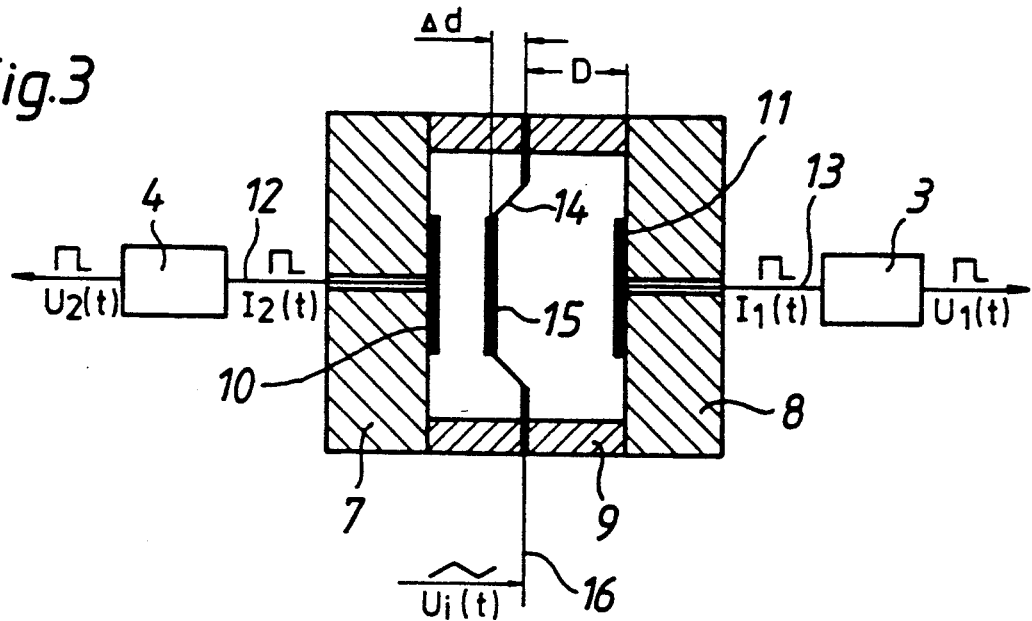
FIG. 3 shows the circuit arrangement in an application in which a capacitance-changing sensor is used to sense inclination and/or acceleration.

As an exemplary embodiment, FIG. 3 shows an inclination or acceleration sensor, whose measurement elements represent two capacitor systems. Two housing parts 7, 8 lie in each case on one spacer ring 9 and are held together by clamping means which are not shown in more detail. The housing parts 7 and 8 are manufactured from electrically insulating material. Within the sensor chamber formed by the parts 7, 8 and 9, the housing parts 7, 8 are fitted with electrode plates 10, 11 from which electrical connections 12, 13 are led out of the chamber.

A sprung diaphragm 14, known per se, which supports a capacitor plate 15 in its central region is clamped in the spacer ring 9. An electrical connection 16 likewise leads from the capacitor plate 15 out of the sensor chamber. The diaphragm 14 together with the capacitor plate 15 is arranged, in the rest position, such that it is located symmetrically between the electrode plates 10, 11 at a spacing D. The electrode plate 10 together with the capacitor plate 15 form a capacitance $C_1$ and the electrode plate 11 together with the capacitor plate 15 forms a capacitance $C_2$. Under the influence of gravity or inertia, the diaphragm 14 together with the capacitor plate 15 can be deflected in the direction of one of the electrode plates 10, 11 by an amount $\Delta d$, as a result of which the capacitances $C_1$ and $C_2$ vary.

The circuit arrangement according to the invention can advantageously be used in order to determine the magnitude of the deflection $\Delta d$ resulting from the change in ratio of the capacitances $C_1$, $C_2$ to one another. In contrast to the arrangement disclosed in DE-PS 2,523,446, the measurement signal voltage $U_i(t)$ is input via the connection 16 to the capacitor plate 15. This is the common electrode for both capacitances $C_1$, $C_2$. The measurement signals $U_1(t)$ and $U_2(t)$ are output via the lines 12, 13, after amplification. The following relationship results from the known electrostatic laws:

$$C_1 = \epsilon \cdot \epsilon_0 \cdot \frac{A}{(D + \Delta d)}$$

where $\epsilon$ = relative dielectric constant of the medium in the sensor chamber, that is to say $\epsilon \approx 1$ for air, $$C_2 = \epsilon \cdot \epsilon_0 \cdot \frac{A}{(D - \Delta d)}$$

$\epsilon_0$ = absolute dielectric constant
A = electrode area
By substitution, this results in:

$$\frac{C_2 - C_1}{C_1 + C_2} = \frac{\Delta d}{D}$$

If the capacitances $C_1$ and $C_2$ are now related to the corresponding signal amplitudes $Us_1$, $Us_2$, $Us_3$ and $Us_4$, this results in:

$$\frac{\Delta d}{D} = \frac{(Us_3 - Us_4) - (Us_1 - Us_2)}{(Us_1 - Us_2) + (Us_3 - Us_4)}$$

The measurement signal, which is dependent on the inclination or acceleration, is thus linearly proportional to the deflection of the capacitor plate 15.

What is claimed is:

1. An apparatus for measuring the ratio of two capacitance values $C_1$ and $C_2$, of two capacitors having very small capacitances, the capacitors to be compared having one of their electrodes interconnected, comprising:
   (a) means for producing a signal voltage $U_i(t)$ over at least two signal periods, which can be differentiated and has defined slopes, and supplying the signal voltage $U_i(t)$, to the interconnected electrode of each of the capacitors, the two capacitors being arranged in parallel paths with respect the signal voltage;
   (b) current amplifiers connected to the two electrodes of the capacitors not connected to each other, the current amplifiers producing amplified output signals $U_1(t)$, $U_2(t)$;
   (c) an A/D convertor means receiving the amplified output signals $U_1(t)$, $U_2(t)$ of the two capacitors, for determining during a first signal period, two digital amplitude values $Us_1$, $Us_2$ of the output signals of one capacitor at an interval of half a signal period (T/2) and, subsequently thereto and likewise at an interval of half a signal period, determining, during a second signal period, two digital amplitude values $Us_3$, $Us_4$ of the output signals of the other capacitor; and
   (d) means for determining from the digital amplitude values the capacitance ratio in accordance with $$\frac{C_1}{C_2} = \frac{(Us_1 - Us_2)}{(Us_3 - Us_4)}.$$

2. A circuit arrangement for measuring the quotient of capacitance values $C_1$, $C_2$ of two capacitors having very small capacitances, the capacitors to be compared being interconnected by means of their one electrode, comprising:
   (a) means for producing a signal voltage $U_i(t)$, which can be differentiated and has defined slopes, and supplying the signal voltage to the interconnected electrode of each of the capacitors, the two capacitors being arranged in parallel paths with respect to the signal voltage;
   (b) two current amplifiers, connected respectively to the two electrodes of the capacitors not interconnected and producing amplified output signals $U_1(t)$, $U_2(t)$;
   (c) A/D convertor means, connected respectively to the amplified output signals $U_1(t)$, $U_2(t)$ of the two capacitors, for determining, parallel in time, two digital amplitude values $Us_1$, $Us_2$ of the output signals of one capacitor and two digital amplitude values $Us_3$, $Us_4$ of the output signals of the other capacitor at an interval of half a signal period (T/2) respectively; and
   (d) determining means, receiving the digital amplitude values, for determining and outputting the capacitance ratio in accordance with, $$\frac{C_1}{C_2} = \frac{(Us_1 - Us_2)}{(Us_3 - Us_4)}.$$

3. The apparatus for measuring the ratio of two capacitance values as claimed in claim 1, wherein the means for producing a signal voltage $U_i(t)$ comprises:
   a frequency-stable square-wave generator; and
   an integrator connected downstream of the square wave generator to generate a triangular-wave voltage signal $U_i(t)$, which signal is applied to the interconnected electrodes of the capacitors.

4. The circuit arrangement as claimed in claim 2, wherein means for producing a signal voltage $U_i(t)$ comprises:
   a frequency-stable square-wave generator;
   an integrator connected downstream of the square wave generator to generate a triangular-wave voltage signal $U_i(t)$, which signal is applied to the interconnected electrodes of the capacitors.

5. The apparatus as claimed in claim 1, wherein the current amplifiers are comprised of two transimpedance amplifiers having a specified synchronization.

6. The circuit arrangement as claimed in claim 2 wherein the current amplifiers are comprised of two transimpedance amplifiers having a specified synchronization.

7. An apparatus for measuring inclination and/or acceleration based on the ratio of two capacitance values $C_1$ and $C_2$, comprising:

a sensor comprised of two fixed electrode plates and a capacitor plate arranged in a moving manner between the electrode plates;

means for providing a signal voltage $U_f(t)$, which can be differentiated, to the capacitor plate of the sensor;

current amplifiers connected to the electrode plates producing amplified output signals $U_1(t)$, $U_2(t)$;

processor means, receiving the output signals $U_1(t)$, $U_2(t)$ from the current amplifiers, for determining, parallel in time, two digital amplitude values $Us_1$, $Us_2$ of the output signals of one capacitor and two digital amplitude values $Us_3$, $Us_4$ of the output signals of the other capacitor at an interval of half a signal period (T/2) respectively, and for linking the output signals to a measured value which is proportional to the inclination or acceleration, in accordance with $$\frac{\Delta d}{D} = \frac{(Us_3 - Us_4) - (Us_1 - Us_2)}{(Us_1 - Us_2) + (Us_3 - Us_4)}$$

where D is the distance at rest between the capacitor plate and the electrode plates and $\Delta d$ is the deflection of the capacitor plate from the rest position.

8. A method for measuring the quotient of two capacitance values $C_1$ and $C_2$, of two capacitors having very small capacitances, the capacitors to be compared being interconnected by means of one of their electrodes, comprising the steps of:

arranging the interconnected electrodes of two capacitors such that the two capacitors are arranged in parallel paths with respect to a signal voltage $U_f(t)$;

producing the signal voltage $U_f(t)$ over at least two signal periods, which can be differentiated, and has defined slopes;

applying the signal voltage to the interconnected electrode of each of the capacitors;

amplifying in current amplifiers output signals from the two electrodes of the capacitors which are not connected to each other;

converting the amplified output signals $U_1(t)$, $U_2(t)$ of the two capacitors to digital amplitude values in an A/D convertor means;

determining, during a first signal period, two digital amplitude values $Us_1$, $Us_2$ of the output signals of one capacitor at an interval of half a signal period (T/2) and, subsequently thereto and likewise at an interval of half a signal period, determining, during the second signal period, two digital amplitude values $Us_3$, $Us_4$ of the output signals of the other capacitor; and determining and outputting the capacitance ratio in accordance with $$\frac{C_1}{C_2} = \frac{(Us_1 - Us_2)}{(Us_3 - Us_4)}.$$

9. A method for measuring the quotient of two capacitance values $C_1$ and $C_2$, of two capacitors having very small capacitances, the capacitors to be compared being interconnected by means of one of their electrodes, comprising the steps of:

arranging the interconnected electrodes of two capacitors such that the two capacitors are arranged in parallel paths with respect to a signal voltage $U_f(t)$;

producing the signal voltage $U_f(t)$, which can be differentiated and has defined slopes;

applying the signal voltage to the interconnected electrode of each of the capacitors;

amplifying in current amplifiers, output signals from the two electrodes of the capacitors which are not connected to each other;

providing amplified output signals $U_1(t)$, $U_2(t)$ of the two capacitors to A/D convertor means;

determining, parallel in time, two digital amplitude values $Us_1$, $Us_2$ of the output signals of one capacitor and two digital amplitude values $Us_3$, $Us_4$ of the output signals of the other capacitor at an interval of half a signal period (T/2) respectively; and determining and outputting the capacitance ratio in accordance with, $$\frac{C_1}{C_2} = \frac{(Us_1 - Us_2)}{(Us_3 - Us_4)}.$$

10. A method for measuring inclination and/or acceleration based on the ratio of two capacitance values $C_1$ and $C_2$, comprising the steps of:

arranging a capacitor plate in a moving manner between two fixed electrode plates to provide a sensor;

providing a signal voltage $U_f(t)$, which can be differentiated, to the capacitor plate of the sensor;

producing amplified output signals $U_1(t)$, $U_2(t)$ in amplifiers connected to the electrode plates;

providing the amplified output signals $U_1(t)$, $U_2(t)$ to a processor means;

determining in the processor means, parallel in time, two digital amplitude values $Us_1$, $Us_2$ of the output signals of one capacitor and two digital amplitude values $Us_3$, $Us_4$ of the output signals of the other capacitor at an interval of half a signal period (T/2) respectively; and linking the output signals to a measured value which is proportional to the inclination or acceleration, in accordance with $$\frac{\Delta d}{D} = \frac{(Us_3 - Us_4) - (Us_1 - Us_2)}{(Us_1 - Us_2) + (Us_3 - Us_4)}$$

where D is the distance at rest between the capacitor plate and the electrode plates and $\Delta d$ is the deflection of the capacitor plate from the rest position.

11. A circuit arrangement for measuring the ratio of capacitance values $C_1$, $C_2$ of two capacitors having very small capacitances, the capacitors to be compared being interconnected by means of one of their electrodes, comprising:

(a) means for producing a signal voltage and supplying the signal voltage to the interconnected electrode of each of the capacitors, the two capacitors being arranged in parallel paths with respect to the signal voltage;

(b) two current amplifiers, connected respectively to the two electrodes of the capacitors not interconnected and producing first and second amplified output signals;

(c) amplitude determining means, receiving the first and second amplified output signals, for determining over a predetermined time interval, first and second amplitude values $U_{s1}$, $U_{s2}$ of the first amplified output signal and for determining over the predetermined time interval, first and second amplitude values $U_{s3}$, $U_{s4}$ of the second amplified output signal; and (d) determining means, receiving the amplitude values, for determining and outputting the capacitance ratio in accordance with $$\frac{C_1}{C_2} = \frac{(U_{s1} - U_{s2})}{(U_{s3} - U_{s4})}.$$

* * * * *